United States Patent
Pang et al.

(10) Patent No.: US 8,427,586 B2
(45) Date of Patent: Apr. 23, 2013

(54) TUNER COMPRISING AN IF FILTER WITH A CONTROLLABLE DAMPING STAGE AND RECEIVER COMPRISING A RESPECTIVE TUNER

(75) Inventors: Kim Suan Pang, Singapore (SG); Vinod Menon, Johor (MY)

(73) Assignee: Thomson Licensing, Issy-les-Moulineaux (FR)

( * ) Notice: Subject to any disclaimer, the term of this patent is extended or adjusted under 35 U.S.C. 154(b) by 195 days.

(21) Appl. No.: 12/735,423

(22) PCT Filed: Jan. 27, 2009

(86) PCT No.: PCT/EP2009/050877
§ 371 (c)(1),
(2), (4) Date: Jul. 15, 2010

(87) PCT Pub. No.: WO2009/095379
PCT Pub. Date: Aug. 6, 2009

(65) Prior Publication Data
US 2010/0309386 A1      Dec. 9, 2010

(30) Foreign Application Priority Data
Jan. 30, 2008  (EP) ..................... 08300059

(51) Int. Cl.
*H04N 5/50* (2006.01)
*H04N 5/44* (2006.01)

(52) U.S. Cl.
USPC ......... 348/731; 348/725; 348/729; 455/190.1

(58) Field of Classification Search ................. 348/731, 348/732, 725, 726, 729; 455/188.1, 193.3, 455/190.1, 339; 334/47, 65
See application file for complete search history.

(56) References Cited

U.S. PATENT DOCUMENTS
| | | | |
|---|---|---|---|
| 6,307,599 B1 | 10/2001 | Komatsu | |
| 7,187,913 B1 * | 3/2007 | Rahn et al. | 455/188.1 |
| 2004/0004674 A1 | 1/2004 | Birleson | |

FOREIGN PATENT DOCUMENTS
GB        2342238        4/2000

OTHER PUBLICATIONS
Search Rept: Mar. 29, 2010.

* cited by examiner

*Primary Examiner* — Jefferey Harold
*Assistant Examiner* — Jean W Desir
(74) *Attorney, Agent, or Firm* — Myers Wolin, LLC

(57) ABSTRACT

The tuner comprises an RF input for receiving a high frequency signal, a downconverter including a mixer for downconverting the high frequency signal, an IF filter coupled to an output of the mixer, an SAW filter coupled to an output of the IF filter and a gain-controlled IF amplifier coupled to an output of the SAW filter for providing an amplified IF signal for a subsequent demodulator. The IF filter includes a controllable damping stage which is in particular usable for improving the noise performance of the tuner. The tuner is designed in a preferred embodiment for reception of analog and digital television signals and the controllable damping stage provides a damping in case of reception of an analog television signal for improving a signal/noise ratio of the analog television signal. The damping stage comprises for example a switching stage utilizing one or several varactor diodes as damping elements.

10 Claims, 4 Drawing Sheets

TUNER COMPRISING AN IF FILTER WITH A CONTROLLABLE DAMPING STAGE AND RECEIVER COMPRISING A RESPECTIVE TUNER

This application claims the benefit, under 35 U.S.C. §365 of International Application PCT/EP2009/050877, filed Jan. 27, 2009, which was published in accordance with PCT Article 21(2) on Aug. 6, 2009 in English and which claims the benefit of European patent application No. 08300059.6, filed Jan. 30, 2008.

FIELD OF THE INVENTION

The present invention relates to a tuner comprising an RF input, a down converter including a mixer coupled to the RF input, an IF filter coupled to an output of the mixer, a SAW filter coupled to an output of the IF filter and a gain controlled IF amplifier. The invention relates further to a receiver comprising a respective tuner and a demodulator. The demodulator is in particular designed for demodulating analog and digital television channels.

BACKGROUND

Tuner circuits used in present television receivers usually comprise an input stage being adapted for receiving two VHF bands and one UHF band and a downconverter with a mixer for downconverting respective analog and/or digital television channels. Usually an integrated IC solution is used comprising a three band mixer with a PLL controlled oscillator and an automatic gain controlled (AGC) IF amplifier. The integrated circuit downconverts a selected RF television channel to a standard intermediate frequency (IF). The downconverted signal is filtered by external filters being coupled to the integrated circuit, for example an IF bandpass filter and a SAW filter. The filtered signal is amplified by the AGC amplifier for providing an appropriate signal for a subsequent demodulator for demodulating the IF signal in accordance with a corresponding television standard.

An integrated tuner circuit of this kind is for example the IC CE5060 manufactured by the company Intel Corporation. A basic block diagram of this IC is shown in FIG. 1, which is shown in the data sheet for the CE5060 and available via internet, document no. D55748-001, February 2006. The CE5060 is a highly integrated circuit for multiband analog/digital terrestrial tuners and/or cable tuners and requires only little external circuitry for assembling a television tuner.

In the block diagram as shown in FIG. 1, the tuner comprises an RF input 1, which is coupled to low noise amplifiers and tunable tracking filters 2 for a first selection of a wanted television channel. The output signals of the low noise amplifiers and tracking filters 2 are coupled to a first amplifier stage 3 of the CE5060, which is followed by a mixer 4. The mixer 4 is controlled by a frequency synthesizer including a PLL controlled oscillator section 5 for downconverting a wanted television channel. The down converted signal is then passed to a second amplifier stage 6 followed by an IF filter 7 for providing a rejection of adjacent channels and an impedance transformation. The output signal of the IF filter 7 then passes to a SAW filter drive amplifier 8 for providing further amplification for a subsequent analog SAW filter 9 and a digital SAW filter 10. The IF filter 7 is for example a passive bandpass filter comprising capacitors and inductors, but no amplifying semiconductor elements.

The output signal of the analog SAW filter 9 is coupled to an analog demodulator 12 for demodulation of an analog television signal. The output of the digital SAW filter 10 is coupled to a gain-controlled IF amplifier 11 and then a digital demodulator 13 for demodulation of a digital television signal. The amplifier 11 is gain-controlled by the digital demodulator 13 via a control signal 15. The demodulators 12, 13 as well as the tuner circuit IC 1 are controlled via I2C bus 16.

New digital demodulators are in the meanwhile on the market, which incorporate also an analog NTSC demodulator, for example the single chip multistandard demodulator DRX 394yJ from the company MICRONAS and the AU8501 from the company Auvitek International. These demodulators are designed for application with a single tuner for DTV and analog NTSC reception and use a single differential IF input for both digital and analog IF signals.

BRIEF SUMMARY OF THE INVENTION

The tuner of the present invention comprises an RF input for receiving a high frequency signal, a downconverter including a mixer for downconverting the high frequency signal, an IF filter coupled to an output of the mixer, an SAW filter coupled to an output of the IF filter and a gain-controlled IF amplifier coupled to an output of the SAW filter for providing an amplified IF signal for a subsequent demodulator. The IF filter includes a controllable damping stage which is in particular usable for improving the noise performance of the tuner.

In a preferred embodiment, the tuner is designed for reception of analog and digital television signals and the controllable damping stage provides a damping in case of reception of an analog television signal for improving a signal/noise ratio of the analog television signal. The damping stage comprises for example a switching stage utilizing one or several damping elements. Investigations have shown that in some situations the gain-controlled IF amplifier provides a considerable noise contribution, when receiving for example an NTSC analog television signal.

The gain-controlled IF amplifier of a television tuner is usually a high gain amplifier for providing a sufficient sensitivity required for reception of the digital television signals. But IF amplifiers as used in present integrated tuner circuits of television receivers show an increased noise figure when operated in a low gain region. By providing a controllable damping stage, the noise performance and also the intermodulation of the tuner circuit can be improved. The controllable damping stage can be advantageously implemented within the IF filter.

The IF filter comprises in particular differential inputs and outputs and a damping element is arranged serially between each of the input terminals and output terminals of the IF filter. In addition, a third damping element may be included, which is coupled in series with a capacitor for tuning of the IF filter. The bias current for the damping elements can be provided advantageously by a High/Low switching output of a digitally controlled integrated tuner circuit. In addition, a tuning capacitor coupled in parallel for each of the first and second damping elements may be included for tuning of the damping stage. For the damping elements, for example switching diodes or varactor diodes, transistors or FETs may be used.

In a further aspect of the invention, the tuner is included in a receiver, in particular in a television receiver, which comprises a demodulator coupled with a single input to the IF output of the tuner. A television receiver of this kind may be applied for example in television sets, set-top boxes, PC TV-cards or in data reception appliances.

BRIEF DESCRIPTION OF THE DRAWINGS

Preferred embodiments of the invention are explained now in more detail below by way of example with reference to schematic drawings, which show.

DETAILED DESCRIPTION OF PREFERRED EMBODIMENTS

Figure 1:
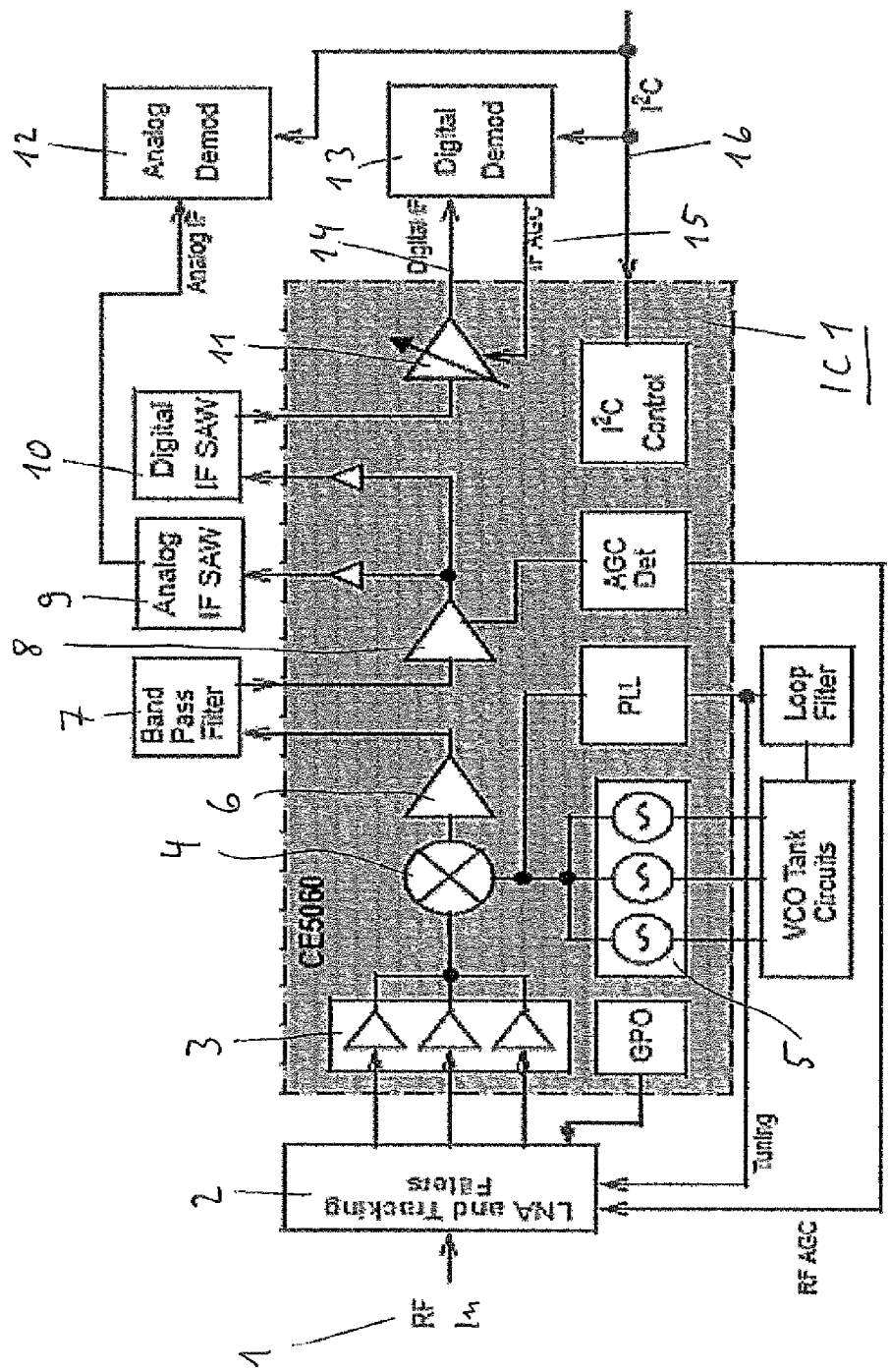
FIG. 1 a basic block diagram of a television receiver utilizing a highly integrated tuner circuit according to prior art, FIG. 2 a television receiver comprising a tuner with an IF filter in accordance with the present invention, FIG. 3 a preferred embodiment of the IF filter shown in FIG. 2, and FIG. 4 the IF filter shown in FIG. 3 in an application with an integrated tuner circuit.
Figure 2:
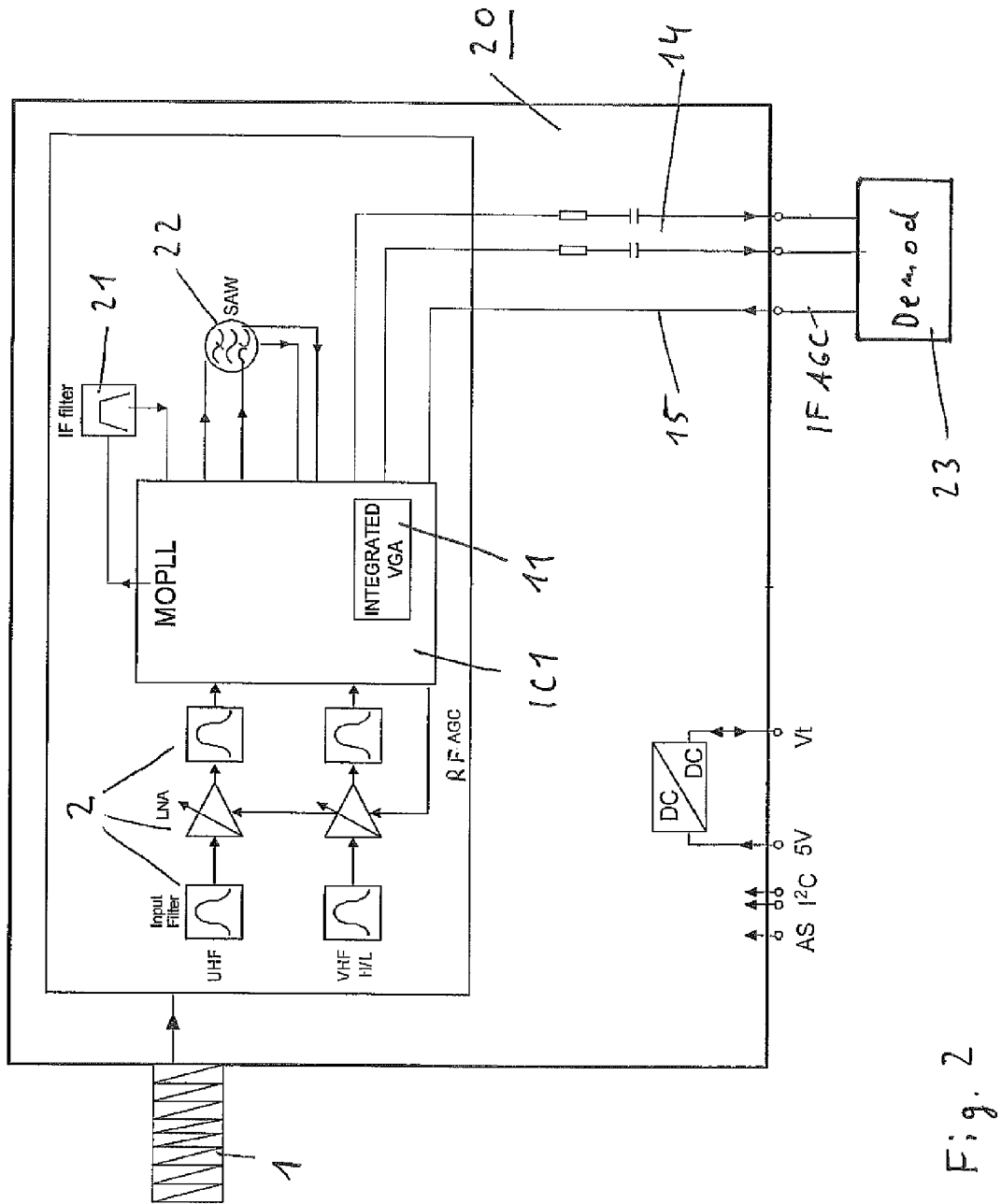

FIG. 2 shows a television receiver comprising a tuner 20 according to the present invention and a demodulator 23 for demodulating of television signals. The tuner 20 comprises an RF input 1 for receiving a high frequency signal, in particular for receiving analog and digital television signals. To the RF input 1 an integrated tuner circuit IC1 is coupled, in this embodiment a highly integrated digitally controlled tuner circuit for analog and digital television signals, for example the IC CE5060, as described before. The integrated tuner circuit IC1 comprises inputs for UHF and VHF signals, which are coupled by means of low noise amplifiers and tracking filters 2 with the RF input 1, as described with regard to FIG. 1.

To the integrated tuner circuit IC1 an external IF filter 21 is coupled with an input and an output, which is arranged ahead of an external SAW filter 22, which is also coupled with an input and an output to the IC1. The SAW filter 22 is used in this embodiment as a channel filter for filtering downconverted analog television signals as well as for filtering down-converted digital television signals. The output of the SAW filter 22 is coupled to an input of a gain controlled IF amplifier 11 inside IC1, and the IF amplifier 11 is coupled with an output via an IF differential output 14 of IC1 to a subsequent demodulator 23. The IF amplifier 11 is controlled by means of a control signal 15 provided by the demodulator 23, as described with regard to FIG. 1. The integrated tuner circuit IC1 comprises further a mixer, a PLL controlled oscillator and additional amplifier stages, as described with regard to FIG. 1. The demodulator 23 is for example the integrated circuit AU8501 of the company Auvitec, as described before. The IF filter 21 is also known as an interstage filter.

For an optimized operation of the demodulator 23, the IF filter 21 includes a controllable damping stage, for example a switching stage, for providing an increased damping in case of reception of an analog television signal. The IF filter 21 may include one or several switching diodes or varactor diodes or a transistor or a FET as a damping element. The television receiver comprising the tuner 20 and the demodulator 23 is applicable in particular for set-top boxes and television sets for providing for example reception of analog and digital terrestrial broadcast television signals.

Figure 3:
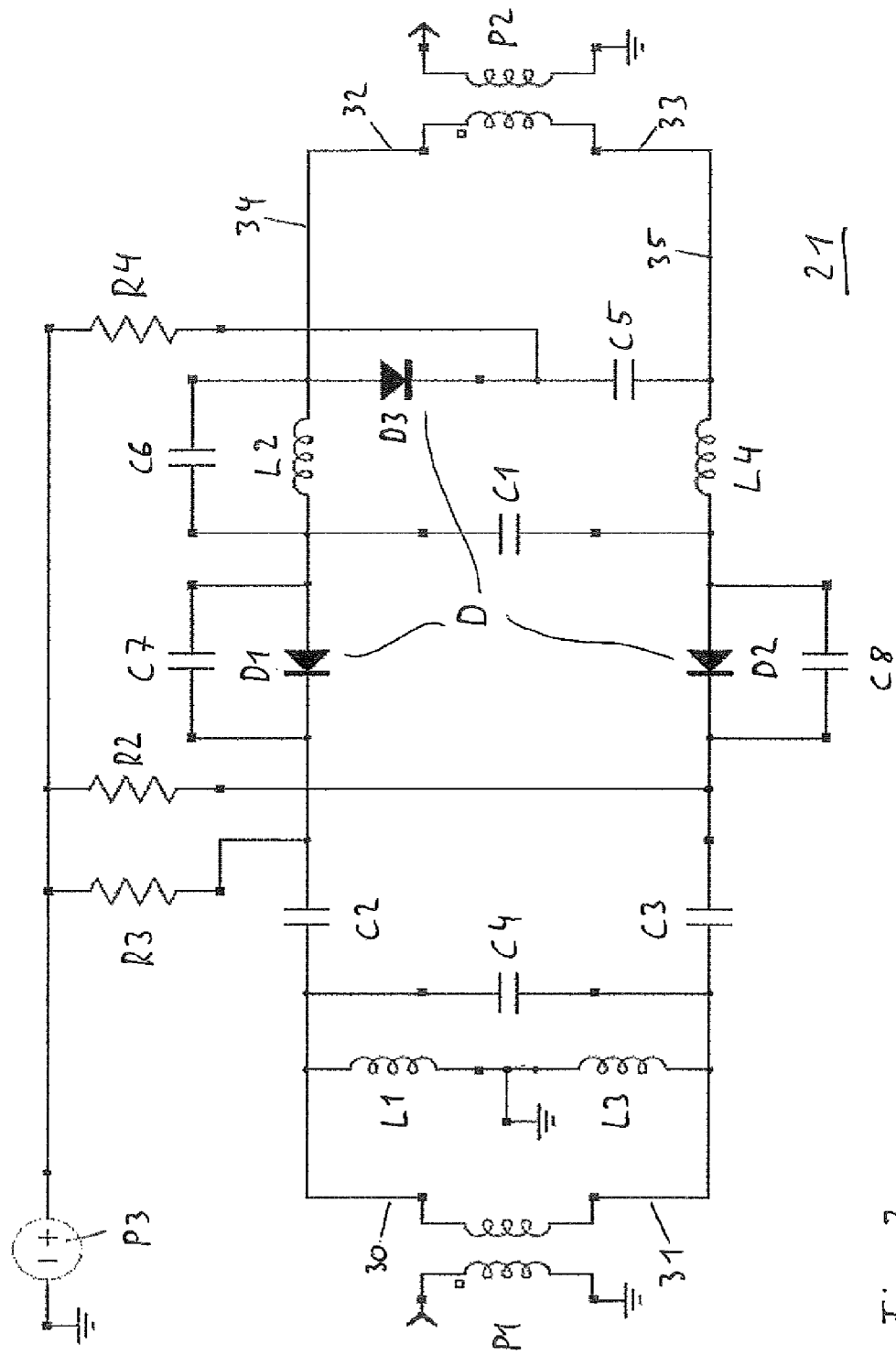

A circuit diagram of a preferred embodiment of an IF filter 21 comprising a controllable damping stage D is shown in FIG. 3. The IF filter 21 comprises a differential input port P1, a differential output port P2, coils L1-L4 and capacitors C2-C6. Capacitor C2 is a coupling capacitor arranged in a signal line 34 connecting terminals 30, 32 and capacitor C3 is a coupling capacitor arranged in a signal line 35 connecting terminals 31, 33. Capacitors C4-C6 and coils L1-L4 are frequency determining elements of the IF filter 21. The IF filter 21 is a bandpass filter, for example a Chebychev filter with 10 MHz bandwidth, and provides an impedance transformation as well as a rejection of adjacent channels.

The controllable damping stage D comprises in this embodiment diodes D1-D3, varactor diodes, which are used in the sense of switching diodes by applying a switching DC voltage via an output port P3 and resistors R2-R4. The output port P3 is for example a High/Low switching output of the integrated tuner circuit IC1. By varying the capacity of the diodes D1-D3 the damping value of the damping stage D can be controlled. As an alternative, also any other switching diodes, for example PIN diodes, transistors or FETs may be used as damping elements for the controllable damping stage D.

Input P1 is a differential input with first and second input terminals 30, 31 and output P2 is a differential output with first and second output terminals 32, 33. The first diode D1 is arranged in series between the first input terminal 30 and the first output terminal 32, and the second diode D2 is arranged in series between the second input terminal 31 and the second output terminal 33. For diode D1 a capacitor 7 is arranged in parallel and for diode D2 a capacitor C8 for improving the damping behaviour of the damping stage D. Capacitor C5 couples signal line 34 with signal line 35 and a third diode D3 is arranged as a switching diode in series with capacitor C5, between signal line 34 and signal line 35.

The switching output P3 provides two DC output voltages, a first one for optimized condition used for analog television reception, in particular NTSC reception, and a second one for normal condition used for digital television reception. When the output voltage of output P3 is low, the damping stage D is in the normal condition, in which a forward bias is provided for the varactor diodes D1-D3 for providing a high capacity, and in which essentially no damping of the damping network D is present. In the optimized condition, a reversed bias is provided for the varactor diodes D1-D3, in which its capacitance is low, for example 1.2 pF. The capacitors C7 and C8 increase the series capacity in optimized condition, reducing the damping effect of the diodes D1, D2 for an improved performance of the damping stage D. The capacitors C7, C8 are bypassed by diodes D1, D2 in normal condition. When the diode D3 is in forward bias, normal condition, D3 has a high capacity and acts as a short circuit for enabling the filtering function of capacitor C5.

The damping stage D together with the frequency determining circuit elements of the IF filter 21 were designed and optimized by using a simulation software. The damping stage D was optimized for providing optimized gain and response condition for an analog NTSC television signal to provide a better video signal/noise ratio and a better Chroma-to-Sound intermodulation. By damping the analog television signal, the IF amplifier 11 operates in a higher gain region, in which the signal/noise ratio is better for analog television. For the digital television signals, for example in accordance with the 8VSB television standard, the damping stage is not or only little effective to achieve a low input sensitivity of the tuner, for example of −83 dBm.

Figure 4:
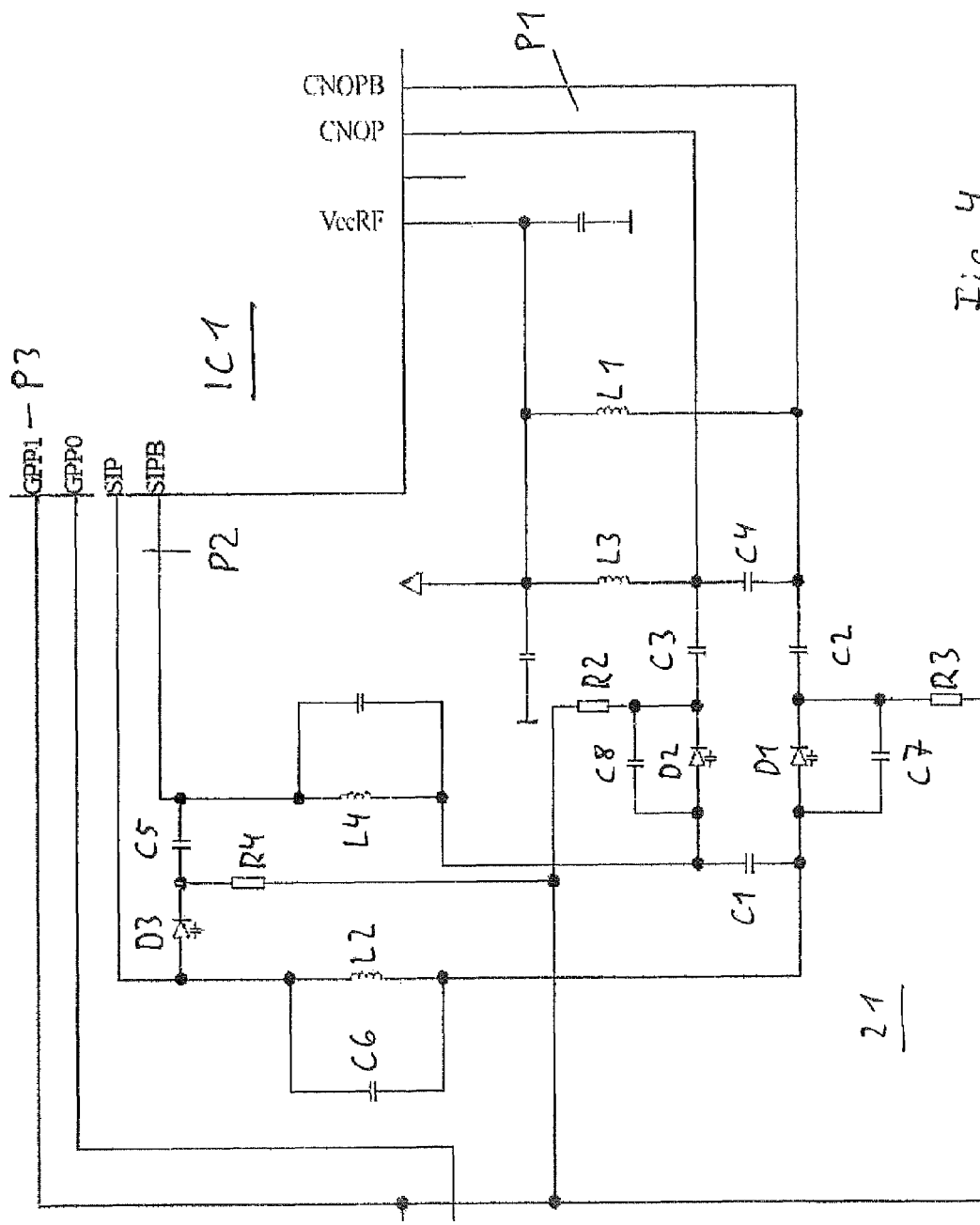

An application of the IF filter 21 with an integrated tuner circuit CE5060 is shown in FIG. 4. The differential input P1 of IF filter 21 is connected to a CNOP/CNOPB differential IF output of IC1 and the output P2 of IF filter 21 is connected to a SIP/SIPB differential input of IC1. The controllable damping of the switching stage D is provided via a general purpose GPP1 switching port P3 of IC1, which provides two output voltages, HIGH=+5V and Low=0V, for providing a reverse bias, when output port P3 is high, and providing a forward bias for the switching diodes D1-D3 when the output port P3 is low. By means of the capacitors C7, C8, the damping of the diodes D1, D2 is optimized with respect to the output port P3, which provides only two output voltages for adjusting the capacity values of the diodes D1, D2. The voltage of the switching output P3 is applied via the resistors R2, R3 and R4 to each of the cathodes of the switching diodes D1-D3. By means of the diode D3, the filtering performance of the IF filter 21 can be adjusted in addition for NTSC reception by shifting of the passband of the IF filter 21.

With the IF filter 21 shown in FIG. 4, the video signal/noise ratio could be improved by about 3.0 dB for NTSC television signals to a value of 50 dB, which provides a good picture performance. For this case, an RF input level of 70 dBpV was applied. The controllable damping stage D does not deteriorate the performance of the tuner, when receiving 8VSB digital television signals. It is therefore possible to provide a tuner with a common path NTSC and digital 8VSB IF output with a high quality NTSC performance, which allows to use a demodulator 23 with a single input for analog and digital television signals. Therefore, the whole NTSC section of the tuner can be omitted, which provides a cost reduction of about 1.30 USD. Because of the drawbacks of the analog video, a signal/noise ratio of 50 dB or more is preferred for NTSC signals, while in the case of digital television, a signal/noise ratio of already 15 dB is sufficient for a perfect picture quality.

Also other embodiments of the invention can be made by a person skilled in the art without departing from the spirit and scope of the present invention. The IF filter with the controllable damping stage according to the invention may be applied also in any other tuner designed for reception of television channels, and is not limited to the applications as described with regard to the preferred embodiments. Applications of the tuner for mobile phones or wireless data transmission are also possible. The invention recites therefore in the claims herein after appended.

The invention claimed is:

1. A tuner comprising:
   an RF input for receiving a high frequency signal,
   a downconverter including a mixer coupled to the RF input for downconverting said high frequency signal,
   an IF filter coupled with an input to an output of the mixer,
   a SAW filter coupled with an input to an output of the IF filter, and
   a gain-controlled IF amplifier coupled with an input to an output of the SAW filter,
   wherein the IF filter includes a differential input with first and second input terminals, a differential output with first and second output terminals, and a controllable damping stage having a first damping element and a second damping element, the first damping element being coupled in series within a first signal line connecting the first input terminal and the first output terminal, and the second damping element being coupled in series within a second signal line connecting the second input terminal and the second output terminal, wherein each of the first and second damping elements comprises a switching stage for providing a controllable damping.

2. The tuner according to claim 1, wherein the IF filter is a bandpass filter comprising a switching diode, a varactor diode, a transistor or a FET as a damping element for improving the noise performance of the tuner.

3. The tuner according to claim 1, wherein a first capacitor is arranged in parallel with the first damping element and a second capacitor is arranged in parallel with the second damping element.

4. The tuner according to claim 1, wherein the IF filter includes a third damping element being coupled in series with a third capacitor, which provide a series circuit connecting the two signal lines of the IF filter.

5. The tuner according to claim 1, wherein the tuner is designed for reception of analog and digital television signals and wherein the controllable damping stage provides a damping in case of reception of an analog television signal for improving a signal/noise ratio of the analog television signal.

6. The tuner according to claim 1, wherein the downconverter and the gain-controlled IF amplifier are integrated together within an integrated tuner circuit, and wherein the controllable damping stage is controlled via a High/Low switching output of the integrated tuner circuit.

7. The tuner according to claim 6, wherein the integrated tuner circuit is designed for multi-band analog/digital terrestrial tuners or cable tuners, and wherein the SAW filter is a channel filter designed for analog and digital television signal filtering.

8. The tuner according to claim 6, wherein the tuner comprises a common path IF output for analog and digital television signals for a connection to a demodulator, which IF output is coupled with an output of the gain-controlled IF amplifier.

9. A receiver comprising:
   a tuner and
   a demodulator coupled with an input to the IF output of the gain-controlled IF amplifier
   wherein the tuner comprises:
   an RF input for receiving a high frequency signal,
   a downconverter including a mixer coupled to the RF input for downconverting said high frequency signal,
   an IF filter coupled with an input to an output of the mixer,
   a SAW filter coupled with an input to an output of the IF filter, and
   a gain-controlled IF amplifier coupled with an input to an output of the SAW filter,
   wherein the IF filter includes a differential input with first and second input terminals, a differential output with first and second output terminals, and a controllable damping stage having a first damping element and a second damping element, the first damping element being coupled in series within a first signal line connecting the first input terminal and the first output terminal, and the second damping element being coupled in series within a second signal line connecting the second input terminal and the second output terminal, wherein each of the first and second damping elements comprises a switching stage for providing a controllable damping.

10. The receiver according to claim 7, wherein the demodulator is a single chip demodulator for demodulating analog and digital television signals.

* * * * *